United States Patent [19]
Lin et al.

[11] Patent Number: 5,658,806
[45] Date of Patent: Aug. 19, 1997

[54] METHOD FOR FABRICATING THIN-FILM TRANSISTOR WITH BOTTOM-GATE OR DUAL-GATE CONFIGURATION

[75] Inventors: Horng-Chih Lin; Liang-Po Chen, both of Hsinchu; Hsiao-Yi Lin, Hualien Hsien; Chun-Yen Chang, Hsinchu, all of Taiwan

[73] Assignee: National Science Council, Taipei, Taiwan

[21] Appl. No.: 547,715

[22] Filed: Oct. 26, 1995

[51] Int. Cl.⁶ .................. H01L 21/265; H01L 21/465
[52] U.S. Cl. ................................ 438/157; 438/158
[58] Field of Search ....................... 437/21, 40 TFI, 437/40 GS, 41 TFI, 41 GS, 228 PL, 228 POL; 156/636.1; 257/347–354

[56] References Cited

U.S. PATENT DOCUMENTS

| | | | |
|---|---|---|---|
| 5,283,455 | 2/1994 | Inoue et al. | 257/347 |
| 5,300,446 | 4/1994 | Fujioka | 437/41 TFI |
| 5,395,801 | 3/1995 | Doan et al. | 437/228 POL |

Primary Examiner—John Niebling
Assistant Examiner—Brian K. Dutton
Attorney, Agent, or Firm—Fish & Richardson, P.C.

[57] ABSTRACT

A method for fabricating a self-aligned thin-film transistor, in accordance with the present invention, first involves forming a gate electrode on an insulating layer. Next, a gate dielectric layer is formed to enclose the gate electrode. Subsequently, a semiconductor layer, a conducting layer, and a first dielectric layer are formed to cover the substrate and the gate dielectric layer. Afterwards, a chemical mechanical polishing process is applied to subsequently polish the first dielectric layer and the conducting layer to expose the semiconductor layer above the gate electrode. Therefore, the conducting layer disposed at opposite sides of the gate electrode is self-aligned to act as the source/drain regions of the fabricated TFT device.

20 Claims, 5 Drawing Sheets

METHOD FOR FABRICATING THIN-FILM TRANSISTOR WITH BOTTOM-GATE OR DUAL-GATE CONFIGURATION

BACKGROUND OF THE INVENTION

1. Field of the Invention

The present invention generally relates to semiconductor device fabrication. In particular, the present invention relates to a method for fabricating a thin-film transistor with a bottom-gate or dual-gate configuration.

2. Description of the Related Art

The thin-film transistor (TFT) is a semiconductor layer deposited on an insulating substrate which is thereafter made into a field-effect transistor. TFT devices are widely used in liquid crystal displays as the elements for driving or switching image pixels thereof, and, also they act as the active load within a static random access memory (SRAM) cell. In general, a TFT device with bottom-gate is a commonly used configuration. Referring to FIG. 1, a TFT device with bottom-gate configuration is shown in cross-sectional view. The bottom-gate TFT device comprises an insulating substrate 1, a gate electrode gate 10, a gate dielectric layer 11, a semiconductor layer 12, a pair of source/drain regions 13, and a dielectric layer 14. The numerals 15 represent a pair of contact windows for exposing the source/drain regions 13. Moreover, metal contacts 16 are connected to the source/drain regions 13 via the contact windows 15 to serve as source/drain electrodes.

The TFT device, as shown FIG. 1, is classified as an inverted staggered type, meaning that gate electrode 10 is first formed on the insulating substrate 1, and the source/drain regions 13 and gate electrode 10 are disposed at opposite sides of the semiconductor layer 12.

However, the main problem plaguing the bottom-gate TFT device is a self-aligned process is difficult to implement. Unlike a TFT device with a top-gate configuration, a gate electrode can serve as a mask while implanting ions to form a pair of source/drain regions, thus constituting a self-aligned process. Therefore, the bottom-gate TFT device not only suffers from greater parasitic capacitance, but also requires another photolithography procedure to define these source/drain regions. For the forgoing reasons, an improved self-aligned method for fabricating thin-film transistor is needed.

SUMMARY OF THE INVENTION

The present invention concerns a method for fabricating a thin-film transistor with bottom-gate or dual-gate configuration fabricated by a self-aligned process.

The present invention achieves the above identified object by providing a method for fabricating a thin-film transistor which comprises: providing an insulating substrate; forming a gate electrode on the substrate; forming a gate dielectric layer covering the gate electrode; subsequently forming a semiconductor layer and a conducting layer overlying the substrate as well as the gate dielectric layer; forming a first dielectric layer on the conducting layer; subsequently polishing the first dielectric layer and conducting layer to expose the semiconductor layer above the gate electrode; forming a second dielectric layer on the first dielectric layer and the exposed semiconductor layer; forming a pair of contact windows through the second and first dielectric layers to expose the conducting layer disposed at opposite sides of the gate electrode; and forming a pair of source/drain electrodes to connect the exposed conducting layer via the contact windows, respectively.

Moreover, the present invention achieves the above identified object by providing a method for fabricating a thin-film transistor, which comprises the following steps: providing an insulating substrate; forming a first gate electrode on the substrate; forming a first gate dielectric layer covering the first gate electrode; subsequently forming a semiconductor layer and a conducting layer overlying the substrate as well as the first gate dielectric layer; forming a first dielectric layer on the conducting layer; subsequently polishing the first dielectric layer and conducting layer to expose the semiconductor layer disposed above the first gate electrode; subsequently forming a second gate dielectric layer and a second gate electrode on the exposed semiconductor layer; forming a second dielectric layer overlying the first dielectric layer and the second gate electrode; forming a pair of contact windows through the second and first dielectric layers to expose the conducting layer disposed at opposite sides of the first gate electrode; and forming a pair of source/drain electrodes to connect the exposed conducting layer via the contact windows, respectively.

BRIEF DESCRIPTION OF THE DRAWINGS

Other objects, features and advantages of the present invention will become apparent by way of the following detailed description of the preferred but non-limiting embodiment. The description is made with reference to the accompanying drawings, wherein.

DESCRIPTION OF THE PREFERRED EMBODIMENT

Referring to FIGS. 2A–2E, the process flow of one preferred embodiment according to the present invention is depicted in cross-sectional views. The method is suitable for fabricating a thin-film transistor on an insulating substrate 2, such as quartz, glass, sapphire, or a silicon oxide layer formed on a silicon wafer, etc.

Figure 1:
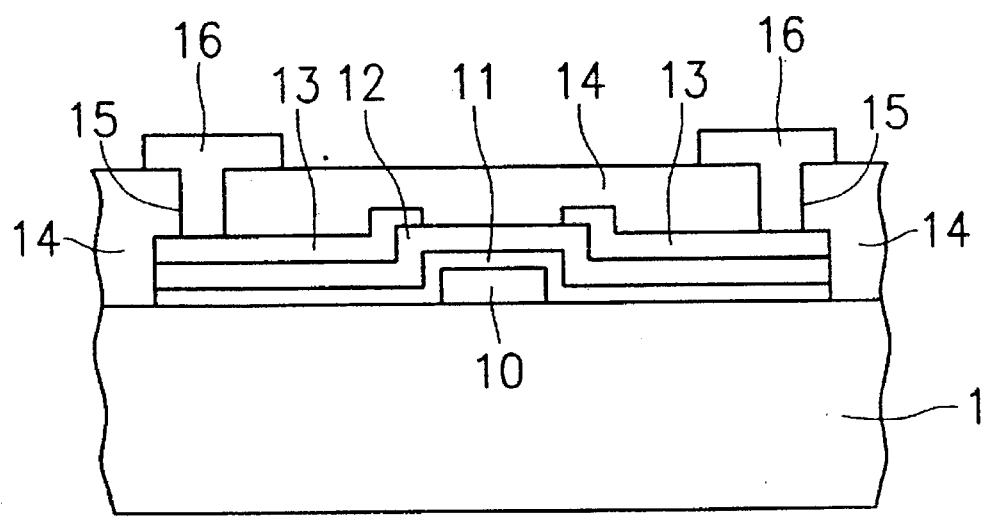
FIG. 1 is the cross-sectional view of a conventional bottom-gate thin-film transistor.
Figure 2A:
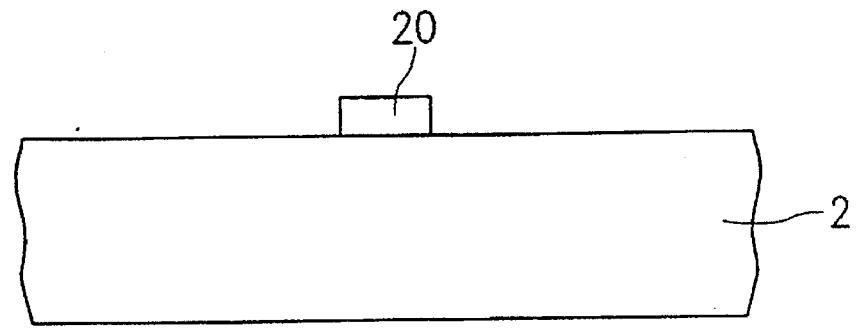
FIGS. 2A–2E are cross-sectional views of one preferred embodiment for fabricating a thin-film transistor in accordance with the present invention.

First, as shown in FIG. 2A, a conducting layer is deposited on the insulating substrate 2. The conducting layer, having a thickness of about 1000 to 3000 Å. The conducting layer is made by either a metal layer (such as chromium, aluminum, or polycide) or doped polysilicon. After patterning and etching the conducting layer, a gate electrode 20 is formed on the insulating substrate 2.

Figure 2B:
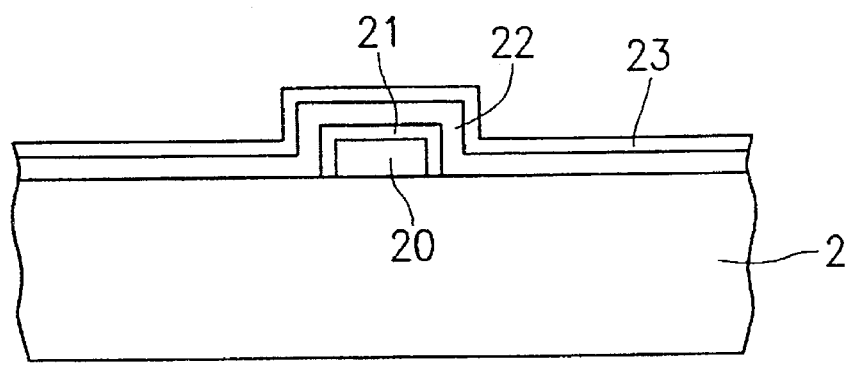

A gate dielectric layer 21 is next formed to enclose the gate electrode 20, as shown in FIG. 2B. The gate dielectric layer 21 has a thickness of about 300 to 1500 Å. For example, the gate dielectric layer 21 is a silicon oxide layer formed by a low temperature oxide (LTO) deposition procedure. If the gate electrode 20 is made of polysilicon, a silicon oxide layer is thermally grown over the gate electrode 20 as the gate dielectric layer 21. Subsequently, a semiconductor layer 22 and a conducting layer 23 are formed on the insulating substrate 2 as well as the gate dielectric layer 21. For example, the semiconductor layer 22 is made of either undoped amorphous silicon or undoped polysilicon, having a thickness of about 1000 to 2000 Å. Furthermore, the conducting layer 23 is made of either doped amorphous silicon or doped polysilicon, having a thickness of about 500 to 1000 Å. The doping process can be performed by in-situ doping or ion implantation.

Figure 2C:
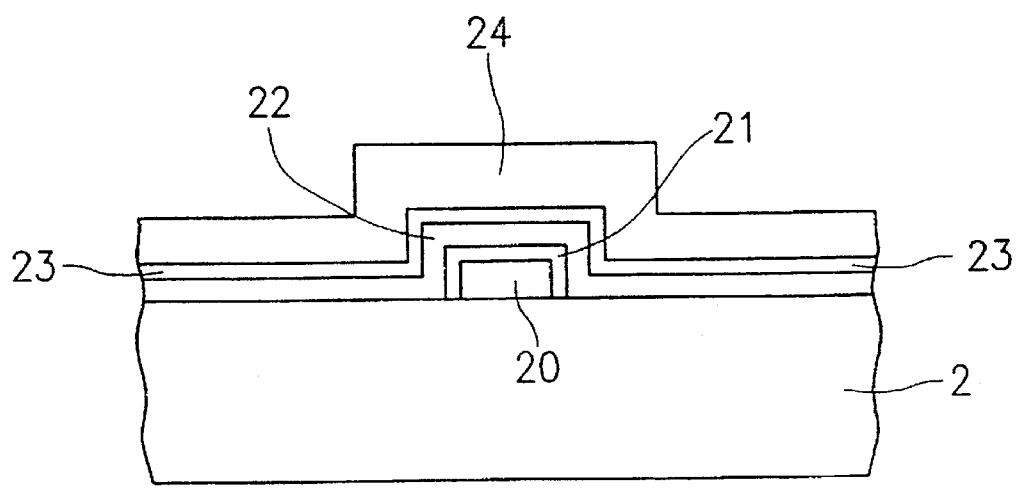
Figure 2D:
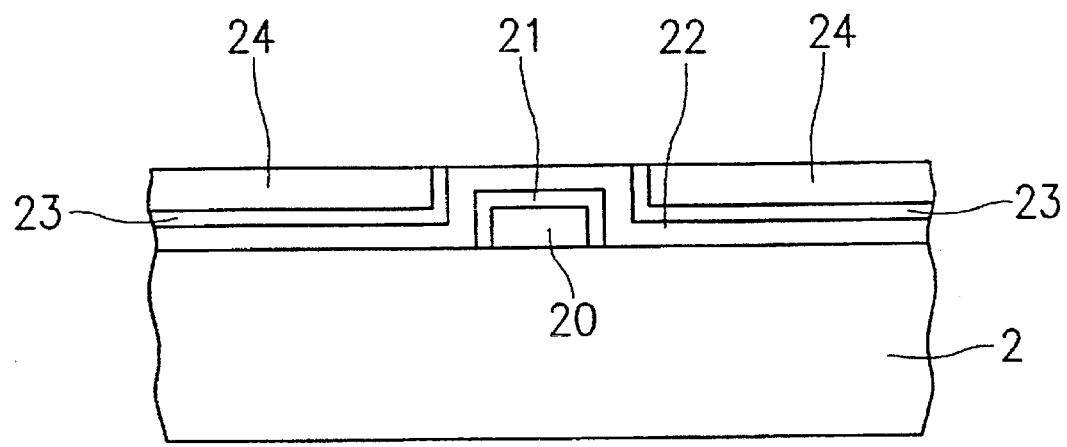

As shown in FIG. 2C, a first dielectric layer 24, having a thickness of about 3000 to 7000 Å, is deposited onto the conducting layer 23 by chemical vapor deposition, such as TEOS oxides formed within a plasma-enhance chemical vapor deposition (PECVD) apparatus. After that, the substrate 2 is subjected to a polishing treatment, such as chemical mechanical polishing. Subsequently, a portion of the first dielectric layer 24 and the conducting layer 23 above the gate electrode 20 are polished to expose the semiconductor layer 22. Also, the semiconductor layer 22 is polished, however, is left a thickness of between about 200 Å and about 1000 Å as depicted in FIG. 2D.

Figure 2E:
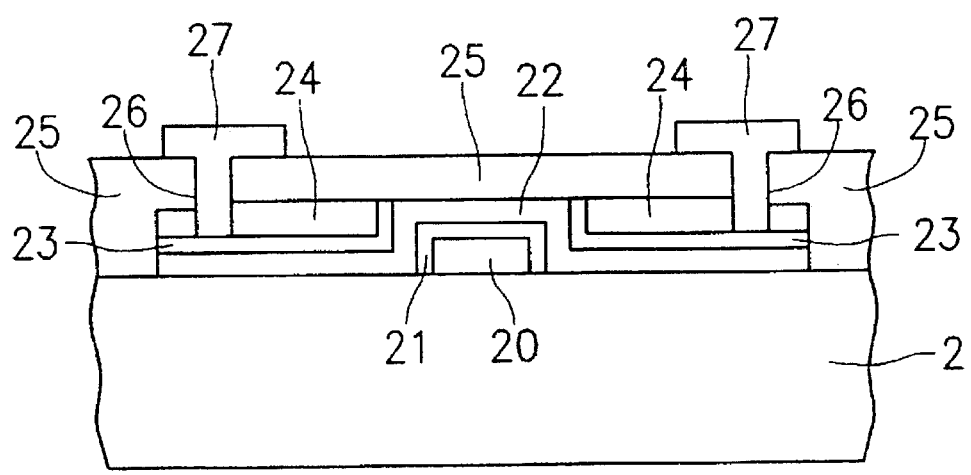

An active region is thereafter defined through a patterning and etching process. Then, a second dielectric layer 26, such as TEOS-oxides formed by PECVD, is deposited to cover the overall surface by chemical vapor deposition. Afterwards, the second and first dielectric layers 24 and 25 are subsequently patterned and etched to form a pair of contact windows 26 to expose the conducting layer 23 These contact windows 26 serve as source/drain regions for the fabricated TFT device. Finally, a metal layer is formed on the second dielectric layer 25 connected to the conducting layer 23 via the contact windows 26. After patterning and etching, a pair of source/drain electrodes 27 are formed and connected to the source/drain regions 25 via the contact windows 26 as depicted in FIG. 2E.

Referring to FIGS. 3A–3E, the process flow of another preferred embodiment according to the present invention is depicted in cross-sectional views. The method is suitable for fabricating a thin-film transistor on an insulating substrate 3, such as quartz, glass, sapphire, or a silicon oxide layer formed on a silicon wafer, etc.

Figure 3A:
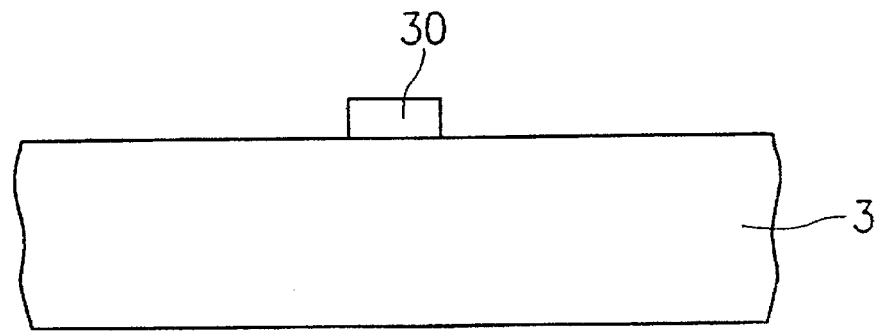
FIGS. 3A–3E are cross-sectional views of another preferred embodiment for fabricating a thin-film transistor in accordance with the present invention.

First, as shown in FIG. 3A, a conducting layer is deposited on the insulating substrate 3 to a thickness of about 1000 to 3000 Å. The conducting layer is made of either a metal layer (such as chromium, aluminum, or polycide) or doped polysilicon. After patterning and etching the conducting layer, a first gate electrode 30 is formed on the insulating substrate 3.

Figure 3B:
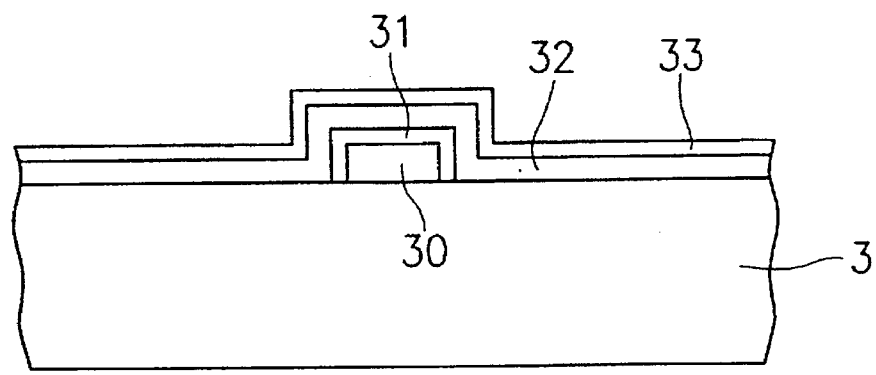

A first gate dielectric layer 31 is next formed to enclose the first gate electrode 30, as shown in FIG. 3B. The first gate dielectric layer 31 has a thickness of about 300 to 1500 Å. For example, the first gate dielectric layer 31 is a silicon oxide layer formed by a low-temperature oxide (LTO) deposition procedure. If the first gate electrode 30 is made of polysilicon, a silicon oxide layer is thermally grown over the gate electrode 30 as the first gate dielectric layer 31. Subsequently, a semiconductor layer 32 and a conducting layer 33 are formed on the insulating substrate 3 as well as the first gate dielectric layer 31. For example, the semiconductor layer 32 is made of either undoped amorphous silicon or undoped polysilicon, having a thickness of about 1000 to 2000 Å. Furthermore, the conducting layer 33 is made of either doped amorphous silicon or doped polysilicon, having a thickness of about 500 to 1000 Å. The doping process can be performed by in-situ doping or ion implantation.

Figure 3C:
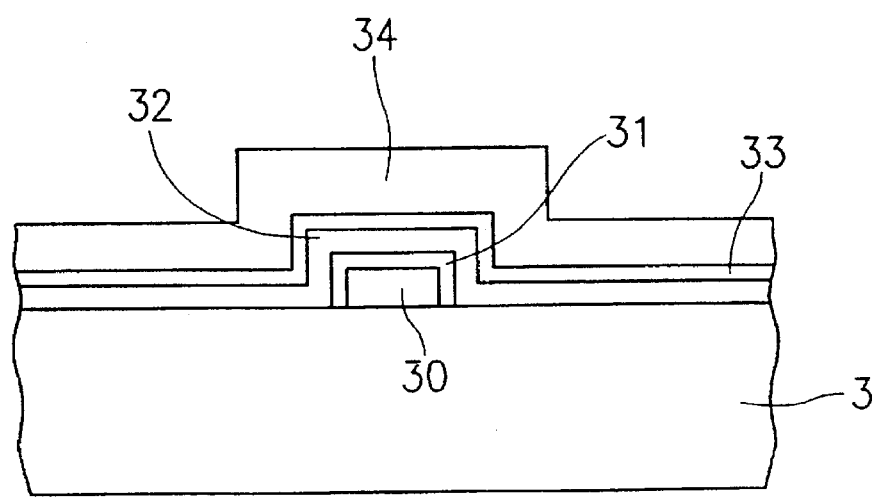
Figure 3D:
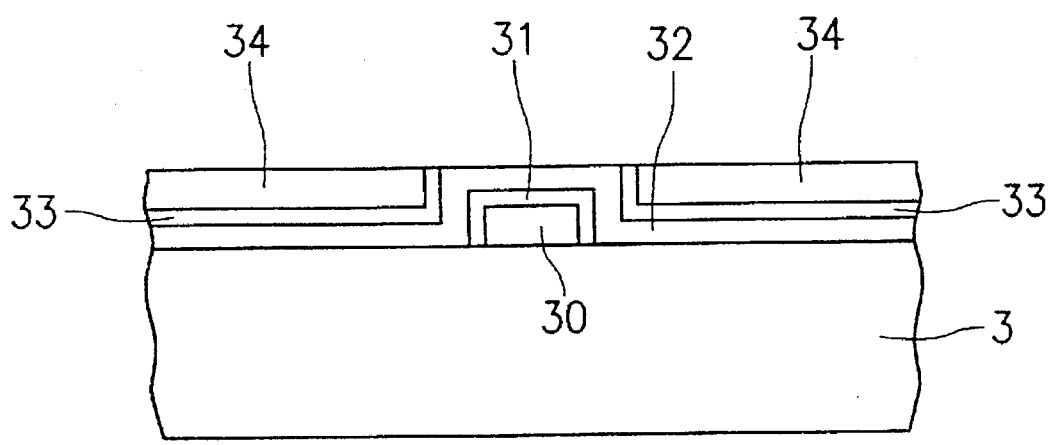

As shown in FIG. 3C, a first dielectric layer 34, having a thickness of about 3000 to 7000 Å, is deposited onto the conducting layer 33 by chemical vapor deposition, such as TEOS oxides formed within a plasma-enhance chemical vapor deposition (PECVD) apparatus. After that, the substrate 3 is subjected to a polishing treatment, such as chemical mechanical polishing. Subsequently, a portion of the first dielectric layer 34, and the conducting layer 33 above the first gate electrode 30 are polished to expose the semiconductor layer 32. The semiconductor layer 32 is polished a thickness of between about 200 Å and about 1000 Å remains as depicted in FIG. 3D.

Figure 3E:
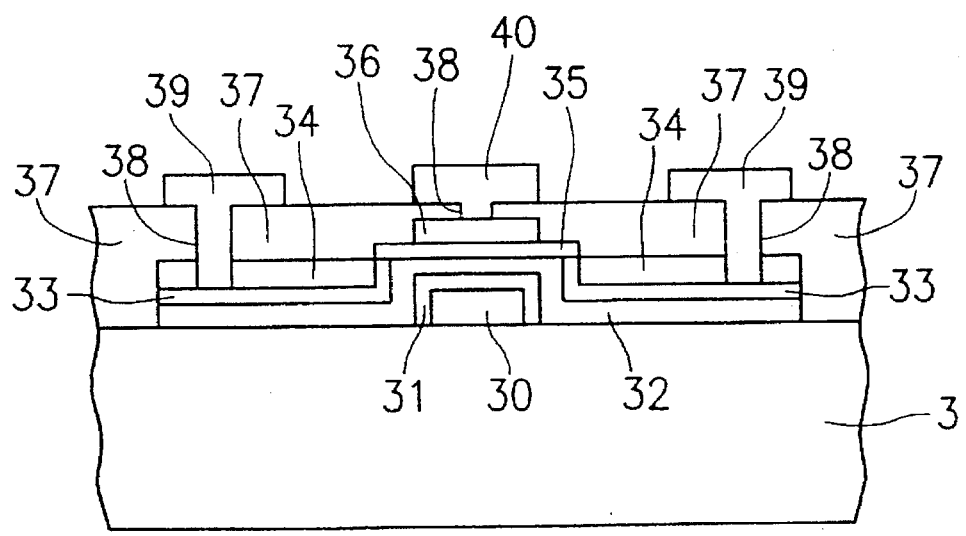

After deposition or thermal oxidation is applied, a second dielectric layer 35 is formed on the exposed semiconductor layer 32. Then, a conducting layer with low resistance is deposited and patterned to form a second gate electrode 36 on the second dielectric layer 35. An active region is thereafter defined through a patterning and etching process. Then, a second dielectric layer 37, comprising, for example, TEOS-oxides formed by PECVD, is deposited to cover the overall surface by chemical vapor deposition. Afterwards, the second and first dielectric layers 37 and 34 are subsequently patterned and etched to form contact windows 38 to expose the conducting layer 33 and the second gate electrode 36. The two parts of the conducting layer disposed at opposite sides of the first gate electrode 30 act as source/drain regions for the fabricated TFT device. Finally, a metal layer is formed on the second dielectric layer 37 connected to the conducting layer 33 and the second gate electrode 36 via the corresponding contact windows 38, respectively. After patterning and etching, a pair of source/drain electrodes 39 are formed and connected to the source/drain regions 33 via the contact windows 38 as depicted in FIG. 3E. Furthermore, the contact metal 40 is connected to the Second gate electrode 36.

In conclusion, a method for fabricating a self-aligned thin-film transistor, in accordance with the present invention, first involves forming a gate electrode on an insulating layer. Next, a gate dielectric layer is formed to enclose the gate electrode. Subsequently, a semiconductor layer, a conducting layer, and a first dielectric layer are formed to cover the substrate and the gate dielectric layer. Afterwards, a chemical mechanical polishing process is carried out to subsequently polish the first dielectric layer and the conducting layer to expose the semiconductor layer above the gate electrode. Therefore, the conducting layer disposed at opposite sides of the gate electrode is self-aligned to act as the source/drain regions of the fabricated TFT device.

While this invention has been described in terms of the above specific embodiments, those skilled in the art will recognize that the invention can be practiced with modifications within the spirit and scope of the appended claims, i.e. that changes can be made in form and detail, without departing from the spirit and scope of the invention. Accordingly, all such changes that come within the purview of the invention encompass the subject matter of the claims which follow.

What is claimed is:

1. A method for fabricating a thin-film transistor, comprising:

providing an insulating substrate;

forming a gate electrode on said substrate;

forming a gate dielectric layer covering said gate electrode;

subsequently forming a semiconductor layer and a conducting layer overlying said substrate as well as said gate dielectric layer;

forming a first dielectric layer on said conducting layer;

subsequently polishing said first dielectric layer and conducting layer to expose said semiconductor layer above said gate electrode;

forming a second dielectric layer on said first dielectric layer and said exposed semiconductor layer;

forming a pair of contact windows through said second and first dielectric layers to expose said conducting layer disposed at opposite sides of said gate electrode; and forming a pair of source/drain electrodes to connect said exposed conducting layer via said contact windows, respectively.

2. The method as claimed in claim 1, wherein said gate electrode is made of metal.

3. The method as claimed in claim 2, wherein said gate dielectric layer is a deposited oxide layer.

4. The method as claimed in claim 1, wherein said gate electrode is made of polysilicon.

5. The method as claimed in claim 4, wherein said gate dielectric layer is a deposited oxide layer.

6. The method as claimed in claim 4, wherein said gate dielectric layer is a thermally-grown oxide layer.

7. The method as claimed in claim 1, said semiconductor layer is made of undoped polysilicon or undoped amorphous silicon.

8. The method as claimed in claim 1, wherein said conducting layer is made of doped polysilicon and doped amorphous silicon.

9. The method as claimed in claim 1, wherein said first dielectric layer is an oxide layer formed by chemical vapor deposition.

10. The method as claimed in claim 1, wherein said second dielectric layer is an oxide layer formed by chemical vapor deposition.

11. A method for fabricating a thin-film transistor, comprising:

providing an insulating substrate;

forming a first gate electrode on said substrate;

forming a first gate dielectric layer covering said first gate electrode;

subsequently forming a semiconductor layer and a conducting layer overlying said substrate as well as said first gate dielectric layer;

forming a first dielectric layer on said conducting layer;

subsequently polishing said first dielectric layer and conducting layer to expose said semiconductor layer disposed above said first gate electrode;

subsequently forming a second gate dielectric layer and a second gate electrode on said exposed semiconductor layer;

forming a second dielectric layer overlying said first dielectric layer and said second gate electrode;

forming a pair of contact windows through said second and first dielectric layers to expose said conducting layer disposed at opposite sides of said first gate electrode; and forming a pair of source/drain electrodes to connect said exposed conducting layer via said contact windows, respectively.

12. The method as claimed in claim 11, wherein said first and second gate electrodes are made of metal.

13. The method as claimed in claim 12, wherein said first and second gate dielectric layers are deposited oxide layers.

14. The method as claimed in claim 11, wherein said first and second gate electrodes are made of polysilicon.

15. The method as claimed in claim 14, wherein said first and second gate dielectric layers are deposited oxide layers.

16. The method as claimed in claim 14, wherein said first and second gate dielectric layers are thermally-grown oxide layers.

17. The method as claimed in claim 11, wherein said semiconductor layer is made of undoped polysilicon or undoped amorphous silicon.

18. The method as claimed in claim 11, wherein said conducting layer is made of doped polysilicon or doped amorphous silicon.

19. The method as claimed in claim 11, wherein said first dielectric layer is an oxide layer formed by chemical vapor deposition.

20. The method as claimed in claim 11, wherein said second dielectric layer is an oxide layer formed by chemical vapor deposition.

* * * * *